United States Patent
Ando et al.

(10) Patent No.: US 10,692,873 B2
(45) Date of Patent: Jun. 23, 2020

(54) GATE FORMATION SCHEME FOR NANOSHEET TRANSISTORS HAVING DIFFERENT WORK FUNCTION METALS AND DIFFERENT NANOSHEET WIDTH DIMENSIONS

(71) Applicant: International Business Machines Corporation, Armonk, NY (US)

(72) Inventors: Takashi Ando, Tuckahoe, NY (US); Ruqiang Bao, Niskayuna, NY (US); Pouya Hashemi, Purchase, NY (US); Choonghyun Lee, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/515,708

(22) Filed: Jul. 18, 2019

(65) Prior Publication Data
US 2020/0006356 A1    Jan. 2, 2020

Related U.S. Application Data

(62) Division of application No. 16/020,233, filed on Jun. 27, 2018, now Pat. No. 10,490,559.

(51) Int. Cl.
*H01L 27/11* (2006.01)
*H01L 29/06* (2006.01)
(Continued)

(52) U.S. Cl.
CPC ...... *H01L 27/1104* (2013.01); *H01L 21/0262* (2013.01); *H01L 21/02532* (2013.01);
(Continued)

(58) Field of Classification Search
CPC ............ H01L 27/1104; H01L 27/0924; H01L 27/1116; H01L 21/02532; H01L 21/0262;
(Continued)

(56) References Cited

U.S. PATENT DOCUMENTS 7,326,656 B2    2/2008    Brask et al.
7,893,492 B2    2/2011    Bedell et al.
(Continued)

OTHER PUBLICATIONS

Ando et al., "Gate Formation Scheme for Nanosheet Transistors Having Different Work Function Metals and Different Nanosheet Width Dimensions," U.S. Appl. No. 16/020,233, filed Jun. 27, 2018.
(Continued)

*Primary Examiner* — Tong-Ho Kim
(74) *Attorney, Agent, or Firm* — Cantor Colburn LLP; Vazken Alexanian

(57) ABSTRACT

Embodiments of the invention are directed to a configuration of nanosheet FET devices formed on a substrate. A non-limiting example of the nanosheet FET devices includes a first nanosheet FET having a first channel nanosheet, a second channel nanosheet over the first nanosheet, a first gate structure around the first channel nanosheet, and a second gate structure around the second channel nanosheet, wherein a first air gap is between the first gate structure and the second gate structure. The nanosheet FET devices further include a second nanosheet FET having a third channel nanosheet, a fourth channel nanosheet over the third nanosheet, a third gate structure around the third channel nanosheet, and a fourth gate structure around the fourth channel nanosheet, wherein a second air gap is between the third gate structure and the fourth gate structure.

20 Claims, 10 Drawing Sheets

(51) Int. Cl.
*H01L 21/02* (2006.01)
*H01L 29/423* (2006.01)
*H01L 21/3213* (2006.01)
*H01L 21/285* (2006.01)
*H01L 21/8238* (2006.01)
*H01L 29/66* (2006.01)
*H01L 27/092* (2006.01)
*H01L 21/3065* (2006.01)
*H01L 21/311* (2006.01)

(52) U.S. Cl.
CPC .. *H01L 21/28556* (2013.01); *H01L 21/32133* (2013.01); *H01L 21/823807* (2013.01); *H01L 21/823821* (2013.01); *H01L 21/823828* (2013.01); *H01L 27/0924* (2013.01); *H01L 27/1116* (2013.01); *H01L 29/0673* (2013.01); *H01L 29/42392* (2013.01); *H01L 29/66545* (2013.01); *H01L 21/0217* (2013.01); *H01L 21/3065* (2013.01); *H01L 21/31116* (2013.01); *H01L 21/823864* (2013.01); *H01L 29/66553* (2013.01)

(58) Field of Classification Search
CPC ......... H01L 21/28556; H01L 21/32133; H01L 21/823807; H01L 21/823821; H01L 21/823828; H01L 21/0217; H01L 21/3065; H01L 21/31116; H01L 21/823864; H01L 29/0673; H01L 29/42392; H01L 29/66545; H01L 29/66553
USPC .......................................................... 257/369
See application file for complete search history.

(56) References Cited

U.S. PATENT DOCUMENTS

| | | | |
|---|---|---|---|
| 8,216,902 | B2 | 7/2012 | Chang et al. |
| 8,587,068 | B2 | 11/2013 | Cheng et al. |
| 8,658,518 | B1 | 2/2014 | Chang et al. |
| 8,765,546 | B1 | 7/2014 | Hung et al. |
| 9,018,054 | B2 | 4/2015 | Yoshida et al. |
| 9,583,486 | B1 | 2/2017 | Ando et al. |
| 9,653,537 | B1 | 5/2017 | Jagannathan et al. |
| 9,954,058 | B1 * | 4/2018 | Mochizuki .......... H01L 29/0673 |
| 2015/0194433 | A1 | 7/2015 | Ponoth et al. |
| 2018/0122899 | A1 | 5/2018 | Guillorn et al. |

OTHER PUBLICATIONS

List of IBM Patents or Patent Applications Treated as Related; Date Filed: Jul. 18, 2019, 2 pages.

* cited by examiner

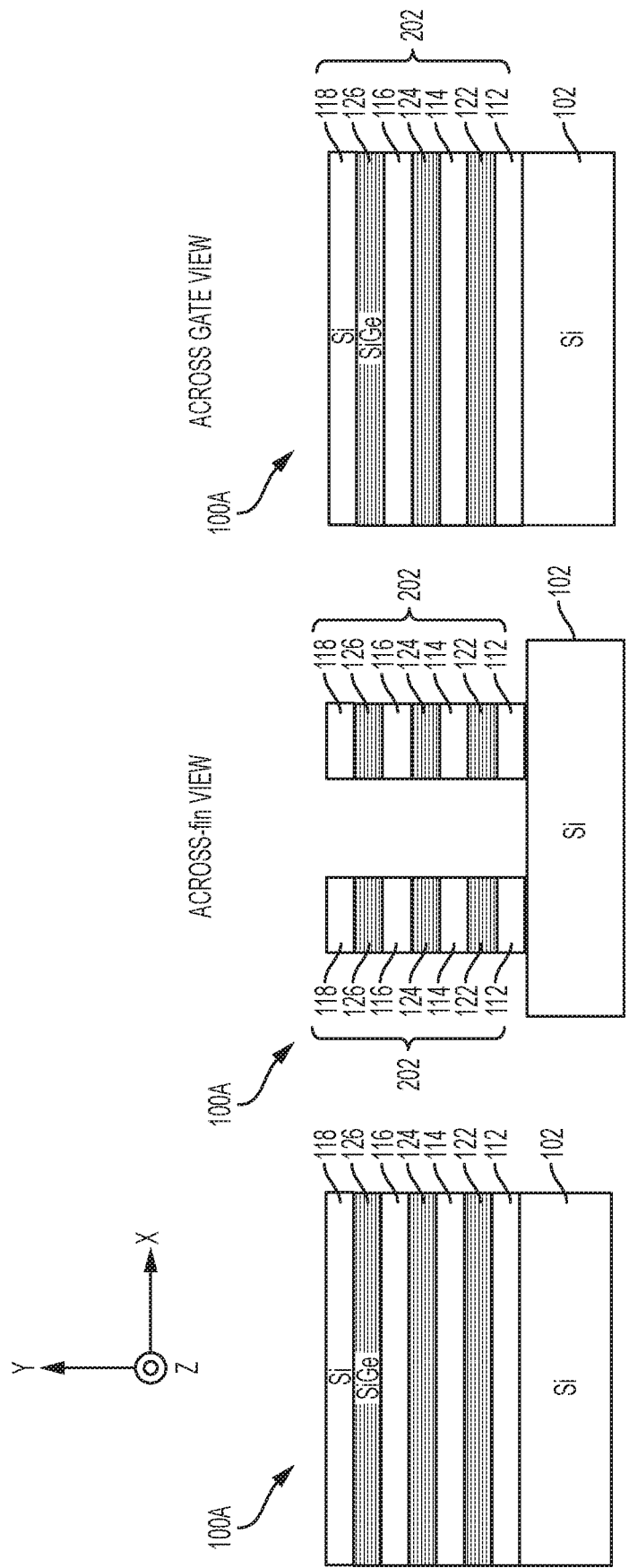

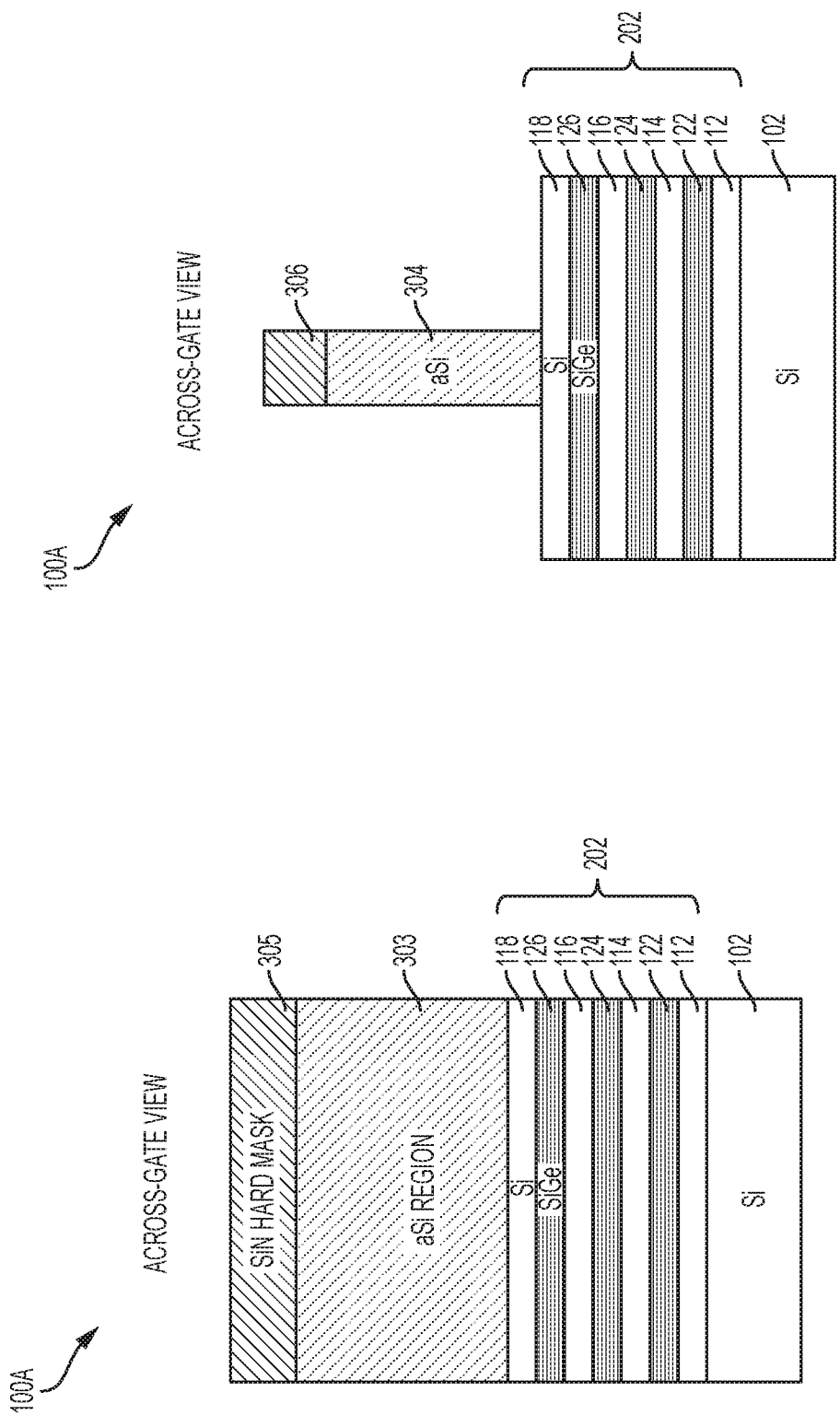

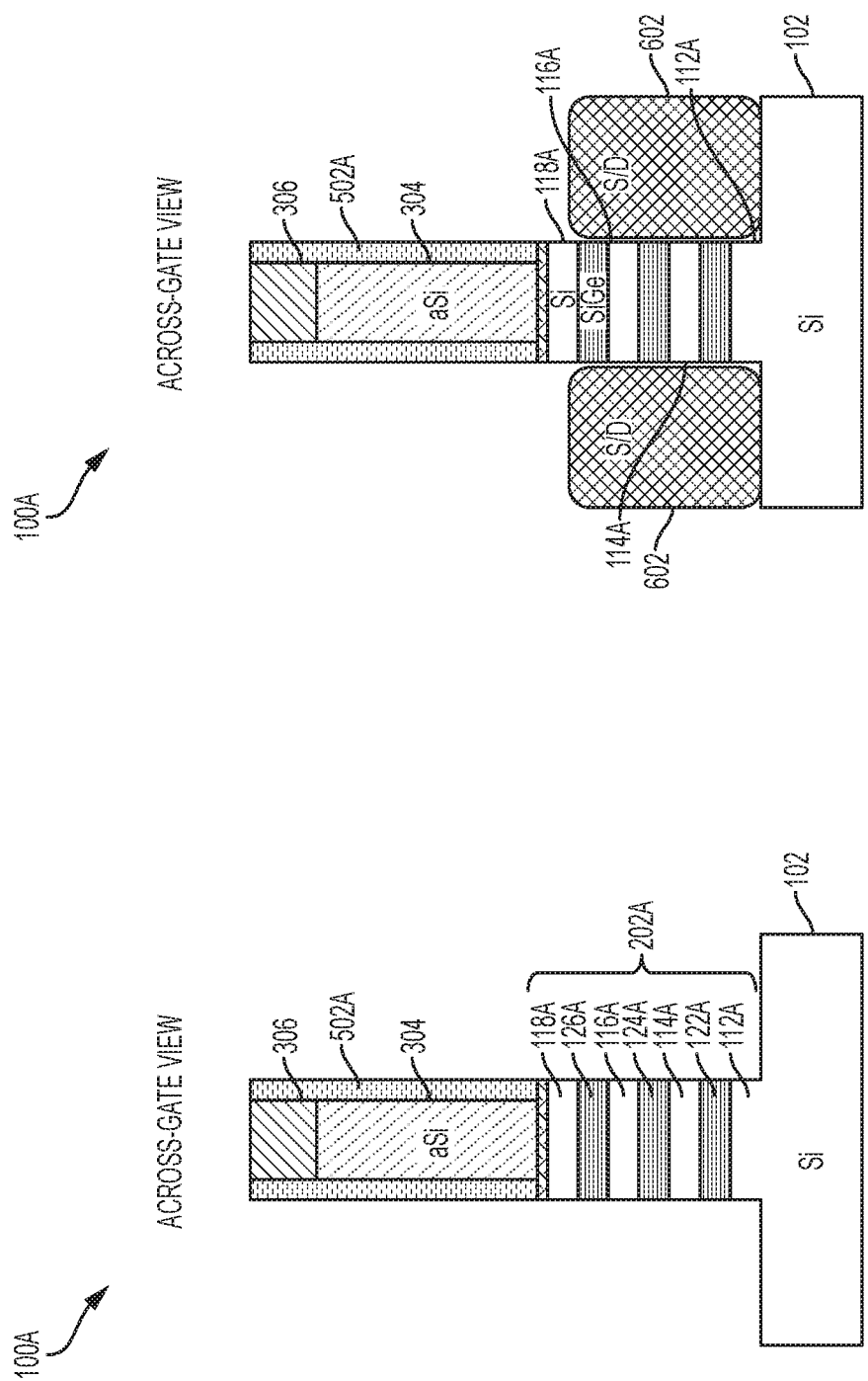

GATE FORMATION SCHEME FOR NANOSHEET TRANSISTORS HAVING DIFFERENT WORK FUNCTION METALS AND DIFFERENT NANOSHEET WIDTH DIMENSIONS

DOMESTIC PRIORITY

This application is a divisional of U.S. application Ser. No. 16/020,233, filed Jun. 27, 2018, the contents of which are incorporated by reference herein in its entirety.

BACKGROUND

The present invention relates in general to fabrication methods and resulting structures for semiconductor devices. More specifically, the present invention relates to fabrication methods and resulting structures for gate structures for nanosheet transistors having different work function metals and different nanosheet width dimensions.

In contemporary semiconductor device fabrication processes, a large number of semiconductor devices, such as n-type field effect transistors (nFETs) and p-type field effect transistors (pFETs), are fabricated on a single wafer. Non-planar transistor device architectures, such as nanosheet (or nanowire) transistors, can provide increased channel density and performance over planar transistors. In contrast to conventional planar FETs, nanosheet transistors include a gate stack that wraps around the full perimeter of multiple nanosheet channel regions for improved control of channel current flow. Nanosheet transistor configurations enable fuller depletion in the nanosheet channel regions and reduce short-channel effects.

SUMMARY

Embodiments of the invention are directed to a method of fabricating a semiconductor device. A non-limiting example of the method includes performing fabrication operations to form a nanosheet field effect transistors (FET) device on a substrate. The fabrication operations include forming a first channel nanosheet, forming a second channel nanosheet over the first nanosheet, forming a first gate structure around the first channel nanosheet, and forming a second gate structure around the second channel nanosheet such that an air gap is between the first gate structure and the second gate structure. An etchant is applied to the first gate structure and the second gate structure such that the etchant enters the air gap and etches the first gate structure and the second gate structure from within the air gap.

Embodiments of the invention are directed to a method of fabricating semiconductor devices. A non-limiting example of the method includes performing fabrication operations to form nanosheet FET devices on a substrate. The fabrication operations include, in a first region of the substrate, forming a first channel nanosheet, forming a second channel nanosheet over the first nanosheet, forming a first gate structure around the first channel nanosheet, and forming a second gate structure around the second channel nanosheet such that a first air gap is between the first gate structure and the second gate structure. The fabrication operations further include, in a second region of the substrate, forming a third channel nanosheet, forming a fourth channel nanosheet over the third nanosheet, forming a third gate structure around the third channel nanosheet, and forming a fourth gate structure around the fourth channel nanosheet such that a second air gap is between the third gate structure and the fourth gate structure. An etchant is applied to the third gate structure and the fourth gate structure such that the etchant enters the second air gap and etches the third gate structure and the fourth gate structure from within the second air gap.

Embodiments of the invention are directed to a configuration of nanosheet FET devices formed on a substrate. A non-limiting example of the nanosheet FET devices includes a first nanosheet FET having a first channel nanosheet, a second channel nanosheet over the first nanosheet, a first gate structure around the first channel nanosheet, and a second gate structure around the second channel nanosheet, wherein a first air gap is between the first gate structure and the second gate structure. The nanosheet FET devices further include a second nanosheet FET having a third channel nanosheet, a fourth channel nanosheet over the third nanosheet, a third gate structure around the third channel nanosheet, and a fourth gate structure around the fourth channel nanosheet, wherein a second air gap is between the third gate structure and the fourth gate structure.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1-13 depict cross-sectional views of sections of a substrate/wafer after various fabrication operations to form different types of nanosheet transistors thereon according to embodiments of the invention, in which:

FIG. 1 depicts a cross-sectional view of a section of the substrate/wafer after initial fabrication stages according to embodiments of the invention;

FIG. 2A depicts a cross-sectional, across-the-fin view of the section of the substrate/wafer after fabrication stages according to embodiments of the invention;

FIG. 2B depicts a cross-sectional, across-the-gate view of the section of the substrate/wafer shown in FIG. 2A, wherein the across-the-gate view results from rotating the across-the-fin view 90 degrees counterclockwise into the page;

FIG. 3 depicts a cross-sectional, across-the gate view of the section of the substrate/wafer after fabrication stages according to embodiments of the invention;

FIG. 4 depicts a cross-sectional, across-the gate view of the section of the substrate/wafer after fabrication stages according to embodiments of the invention;

FIG. 5 depicts a cross-sectional, across-the gate view of the section of the substrate/wafer after fabrication stages according to embodiments of the invention;

FIG. 6 depicts a cross-sectional, across-the gate view of the section of the substrate/wafer after fabrication stages according to embodiments of the invention;

FIG. 7 depicts a cross-sectional view, taken along line A-A of FIG. 6, which is an across-the fin view, and which is expanded from FIG. 6 to show multiple regions of the substrate/wafer after fabrication stages according to aspects of the invention;

FIG. 8 depicts the same cross-sectional view shown in FIG. 7 after fabrication stages according to embodiments of the invention;

FIG. 9 depicts the same cross-sectional view shown in FIG. 8 after fabrication stages according to embodiments of the invention;

FIG. 10 depicts the same cross-sectional view shown in FIG. 9 after fabrication stages according to embodiments of the invention;

FIG. 11 depicts the same cross-sectional view shown in FIG. 10 after fabrication stages according to embodiments of the invention;

FIG. 12 depicts the same cross-sectional view shown in FIG. 11 after fabrication stages according to embodiments of the invention; and FIG. 13 depicts the same cross-sectional view shown in FIG. 12 after fabrication stages according to embodiments of the invention.

DETAILED DESCRIPTION

Figure 7:
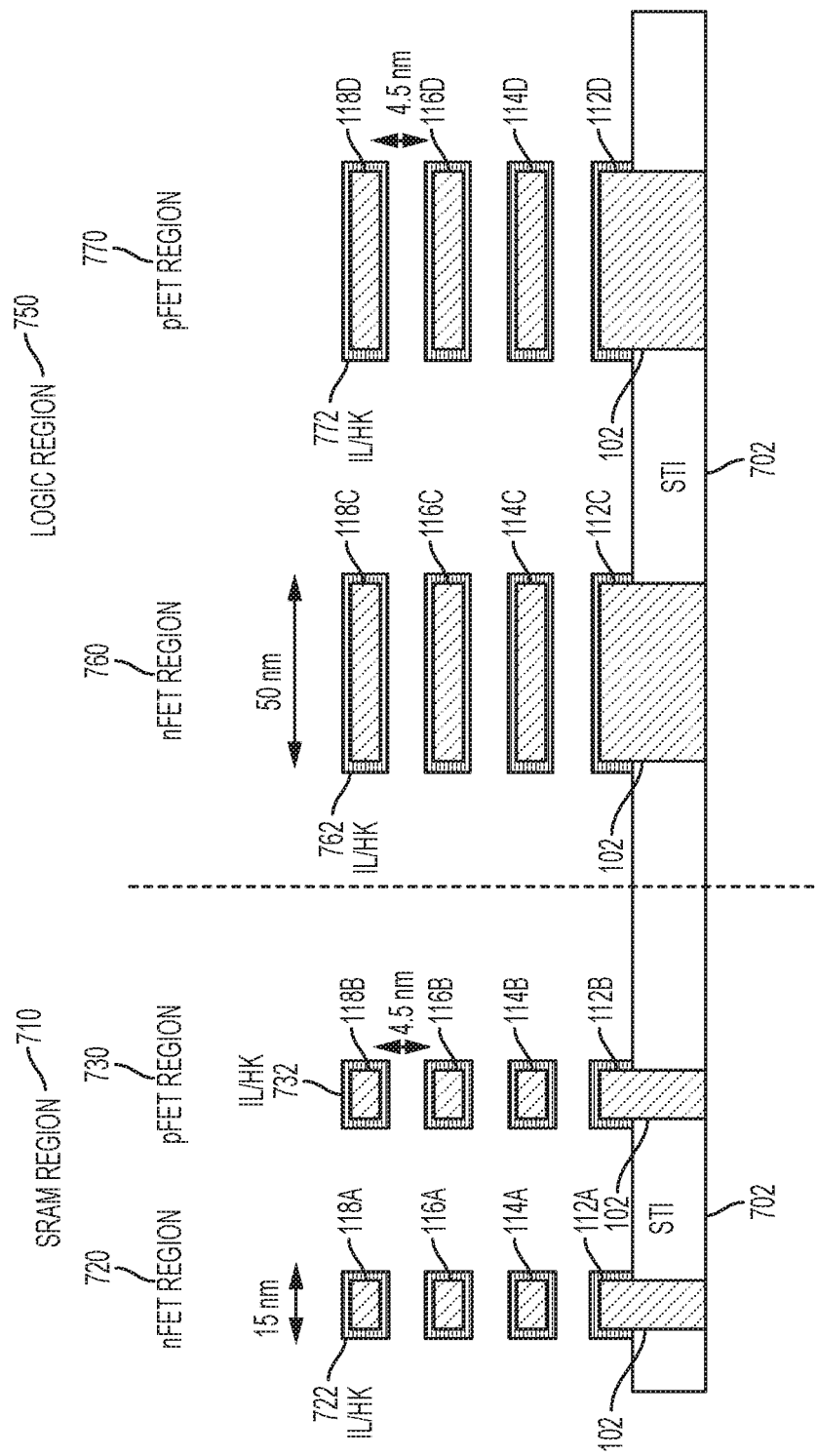

It is understood in advance that although this invention includes a detailed description of exemplary gate-all-around (GAA) nanosheet FET architectures having silicon (Si) channel nanosheets and SiGe sacrificial nanosheets, embodiments of the invention are not limited to the particular FET architectures or materials described in this specification. Rather, embodiments of the present invention are capable of being implemented in conjunction with any other type of nanosheet/nanowire FET architecture or materials now known or later developed. In this detailed description and in the claims, the terms nanosheet and nanowire are treated as being synonymous.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nano sheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet channel FETs on the same substrate when the nanosheet channel FETs have different design rules. Design rules are a series of parameters provided by semiconductor manufacturers that enable the designer to verify the correctness of a mask set. Design rules are specific to a particular semiconductor manufacturing process. A design rule set specifies certain geometric and connectivity restrictions to ensure sufficient margins to account for variability in semiconductor manufacturing processes, thereby ensuring that most of the parts work correctly. For example, memory circuitry (e.g., SRAM) generally needs less current than logic circuitry. When the memory/logic circuitry is formed from n-type and p-type nanosheet FETs, the design rules can require that the channel nanosheets of the memory nanosheet FETs are more narrow than the channel nanosheets of the logic nanosheet FETs in order to draw less current through the memory nanosheet FETs than the logic nanosheet FETs. A typical design rule is to require that the widths of the channel nanosheets in the logic circuitry be about three times (3×) the widths of the channel nanosheets in the memory circuitry.

Because n-type and p-type nanosheet FETs can utilize different work function (WF) metals, the process for fabricating n-type and p-type nanosheet FETs can require depositing a particular WF metal over the n-type and p-type channel nanosheets, and then selectively removing the deposited WF metal from the channel nanosheets that do not require that type of WF metal. The process to selectively remove the deposited WF metal must be applied for a duration and/or intensity that is sufficient to remove the deposited WF metal from the wider channel nanosheet, which means that the process to selectively remove the deposited WF metal will be applied to the wider channel nanosheets much longer and more intensely than the narrower channel nanosheets require. Although the regions where the deposited WF metal is expected to remain are typically protected in some manner (e.g., covered with a mask), overexposure to the removal process can result in the removal etchant breaking through the protection mechanism (e.g., by etching through the deposited WF metal underneath the mask) and attacking the deposited WF metal in the regions where the deposited WF metal is expected to remain.

Turning now to an overview of aspects of the invention, embodiments of the invention provide fabrication methods and resulting structures for gate structures (e.g., WF metals) for nanosheet transistors having different lateral width dimensions. In embodiments of the invention, the gate metal deposition process is configured to deposit the gate metal over different types of channel nano sheets in a manner that leaves an air gap in the deposited gate metal between the channel nanosheets. In embodiments of the invention, the air gap extends along a width dimension of the channel nanosheet that the gate metal surrounds. The air gap creates additional surface areas of the gate metal, and these additional surface areas provide additional access points for the etchant that is used to remove the gate metal from selected ones of the channel nanosheets. The additional access points on the deposited gate metal speed up the gate metal removal process and make speed of the gate metal removal process less dependent on the width dimension of the channel nanosheet. Accordingly, using the gate deposition process according to aspects of the invention, removing the deposited gate metal from around the narrow channel nanosheets can occur in substantially the same amount of time that it takes to remove the deposited gate metal from around the wide channel nanosheets, and the gate metal removal process does not need to be applied for a duration/intensity that would allow the removal etchant to attack the gate metal in the regions where the gate metal is expected to remain.

In embodiments of the invention, the air gap is created by depositing a first region of the gate metal using a conformal deposition process (e.g., atomic layer deposition (ALD)). The conformal deposition places the first region of the gate metal around each channel nanosheet but is stopped just short of filling the spaces between the channel nanosheets, thereby creating an initial air gap between the channel nanosheets. End regions of the air gap are closed off by depositing over the first region a second region of the gate metal using a non-conformal deposition process (e.g., chemical vapor deposition (CVD) or physical vapor deposition (PVD)). As used herein, the term "non-conformal" does not mean that the process has no conformal characteristics. It means that the process has a less than about 100% conformal characteristic. Non-conformal deposition processes are less precise than conformal deposition processes. As a result, the non-conformal deposition closes off the ends of the initial gap to form a uniform outer surface of the deposited gate metal but is unable to fill in the initial air gap, thereby leaving virtually all of the initial gap space intact. In embodiments of the invention, the second region of the non-conformally deposited gate metal is relatively thin in comparison to the first region of the conformally deposited gate metal. In the regions of the substrate where the gate metal is removed, the removal etchant moves through the relatively thin non-conformally deposited second region of the gate metal fairly quickly to access the gate metal surfaces areas that define the air gap. In embodiments of the invention, the first region, second region and air gaps of the gate metal are removed from selected ones of the nanosheet channels and replaced with another type of gate metal, for example a WF gate metal suitable for p-type nanosheet FETs or a WF gate metal suitable for n-type nanosheet FETs. In embodiments of the invention, the various first regions, second regions and air gaps of the gate metal remain over selected one of the channel nanosheets and are part of the final gate structure of the nanosheet FETs that are formed from the selected ones of the channel nanosheet. Accordingly, using the gate deposition process according to aspects of the invention, removing the deposited gate metal from around the narrow channel nanosheets can occur in substantially the same amount of time that it takes to remove the deposited gate metal from around the wide channel nanosheets, and the gate metal removal process does not need to be applied for a duration/intensity that would allow the removal etchant to attack the gate metal in the regions where the gate metal is expected to remain.

Turning now to a more detailed description of fabrication operations according to aspects of the invention, FIGS. 1-13 depict cross-sectional views of various sections 100A, 710, 750 of a substrate/wafer 102 after various fabrication operations to form nanosheet transistors having wide nanosheets (e.g., nFET region 760 and pFET region 770 shown in FIG. 7) and narrow nanosheets (e.g., in a nFET region 720 and pFET region 730 shown in FIG. 7) on the same substrate 102 in accordance with embodiments of the invention. As shown in FIG. 1, after initial fabrication stages, an alternating series of Si nanosheet layers 112, 114, 116, 118 and SiGe sacrificial nanosheet layers 122, 124, 126 have been formed in a stack over a Si substrate 102. In some embodiments of the invention, the SiGe sacrificial nanosheet layers 122, 124, 126 can be within a range from SiGe 20% to SiGe 40%. The notations "SiGe 20%" and "SiGe 40%" are used to indicate that about 20% of the SiGe material is Ge, or that about 40% of the SiGe material is Ge, respectively.

With reference to the X/Y/Z diagram depicted in FIG. 1, the various elements depicted in FIGS. 1-13 extend along a first axis (e.g., X-axis) to define width dimensions, and extend along a second axis (e.g., Y-axis) perpendicular to the X-axis to define height dimensions. Although not specifically depicted in the 2D cross-sectional views shown in FIGS. 1-13, the various elements depicted also extend along a third axis (e.g., Z-axis) perpendicular to the first axis and the second axis to define depth dimensions. In accordance with standard GAA nanosheet transistors architectures, various elements of the depicted fabrication stages extend completely around other elements in the X, Y, and Z directions.

In embodiments of the invention, the alternating nanosheet layers 112, 122, 114, 124, 116, 126, 118 depicted in FIG. 1 can be formed by epitaxially growing one layer and then the next until the desired number and desired thicknesses of the nanosheet layers 112, 122, 114, 124, 116, 126, 118 are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

FIG. 2A depicts a cross-sectional, across-the-fin view of the section/portion 100A of the substrate 102 after fabrication stages according to embodiments of the invention. FIG. 2B depicts a cross-sectional, across-the-gate view of the section/portion 100A of the substrate 102 shown in FIG. 2A, wherein the across-the-gate view results from rotating the across-the-fin view 90 degrees counterclockwise into the page. In FIGS. 2A and 2B, known semiconductor fabrication operations have been used to etch or recess the alternating nanosheet layers 112, 122, 114, 124, 116, 126, 118 shown in FIG. 1 to form multiple intermediate elongated columns/fin 202. In an example fabrication process, a patterned hard mask (not shown) is deposited over the alternating nanosheet layers 112, 122, 114, 124, 116, 126, 118. The pattern of the hard mask defines the footprints of the multiple intermediate elongated columns 202 shown in FIGS. 2A and 2B. FIG. 2A is a view of the intermediate elongated columns 202 by a person standing in front the narrowest sidewalls of the intermediate elongated columns 202 (i.e., in the across-fin direction). FIG. 2B is a view of one of the intermediate elongated columns 202 by a person standing in front of the elongated sidewall of one of the intermediate elongated columns 202 (i.e., in the across-gate direction). An etch (e.g., an RIE) or a recess is applied to remove the portions of the alternating nanosheet layers that are not covered by the patterned hard mask, thereby forming the intermediate elongated columns 202.

FIGS. 3-6 are the cross-sectional, across-the-gate view used in FIG. 2B. In FIG. 3, known semiconductor fabrication operations have been used to form a dummy gate stack region 303 and a hard mask layer 305, configured and arranged as shown. Dummy gate stack can be formed of an amorphous silicon (a-Si) layer on top of a thin layer of silicon oxide or silicon oxynitride. Hard mask 305 can formed from SiN and/or $SiO_2$. Although only one of the intermediate elongated fin-shaped columns 202 is shown in the two-dimensional (X-axis and Y-axis) cross-sectional diagram shown in FIG. 3, multiple additional intermediate elongated fin-shaped columns (not shown) are positioned behind the intermediate elongated fin-shaped column 202 and extend into the page in the Z-axis direction. The additional intermediate elongated fin-shaped columns positioned behind the intermediate elongated fin-shaped column 202 are substantially the same as the intermediate elongated fin-shaped column 202. Similarly, although the a-Si region 303 is depicted in a cross-sectional, two-dimensional view in FIG. 3, in practice, the aSi region 303 is formed over and around the elongated sidewalls of each of the intermediate elongated fin-shaped columns 202 in the Z-axis direction.

In FIG. 4, known semiconductor fabrication operations have been used to form the dummy gate 304. For example, the dummy gate 304 can be formed by patterning the hard mask layer 305 (shown in FIG. 3) to form the hard mask 306. An etching process (e.g., an RIE) is applied to the a-Si region 303 (shown in FIG. 3) to form the dummy gate 304.

In FIG. 5, known fabrication known fabrication operations have been used to form dummy offset gate spacers 502A. The dummy offset gate spacers 502A can be formed by a conformal deposition of a layer of dielectric material (e.g., a silicon nitride material) (not shown) followed by a directional etch (e.g., RIE) to form the dummy offset gate spacers 502A. In embodiments of the invention, the dummy offset gate spacers 502A can also be formed using a spacer pull down formation process.

As also shown in FIG. 5, subsequent to formation of the dummy gate spacers 502A, an etch or a recess is applied to the exposed surfaces of the intermediate elongated columns 202 (shown in FIG. 4) to form a fin-shaped column 202A. The etch/recess forms the fin-shaped columns 202A by etching/recessing the portions of the intermediate elongated fin-shaped columns 202 not covered by the dummy gate 304 and the dummy offset gate spacers 502A. Each of the fin-shaped columns 202A includes a stack of alternating Si/SiGe nanosheet layers 112A, 122A, 114A, 124A, 116A, 126A, 118A.

In FIG. 6, source/drain (S/D) regions 602 have been formed, and the sacrificial SiGe portions 122A, 124A, 126A have been removed. Prior to forming the S/D regions 602 and removing the sacrificial SiGe portions 122A, 124A, 126A, known semiconductor fabrication processes were used to form pull back end region cavities (now shown) in the SiGe sacrificial nanosheet regions 122A, 124A, 126A (shown in FIG. 5) from underneath the dummy offset gate spacers 502A, for example, a hydrogen chloride (HCl) gas isotropic etch process, which etches SiGe without attacking Si. Known fabrication operations are used to form inner spacers (now shown) in the end region cavities.

After formation of the inner spacers, known semiconductor device fabrication processes are used to form S/D regions 602. In embodiments of the invention, the S/D regions 602 are formed using an epitaxial layer growth process on the exposed sidewalls of the Si channel nanosheet regions 112A, 114A, 116A, 118A. In-situ doping (ISD) can be applied to form doped S/D regions 602, thereby creating the necessary junctions (source/channel or drain/channel) for the nanosheet transistors that will be formed in the pFET regions 730, 770 (shown in FIG. 7) and the nFET regions 720, 760 (shown in FIG. 7). Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B). After formation of the S/D regions 602, the sacrificial SiGe portions 122A, 124A, 126A (shown in FIG. 5) and the inner spacers (not shown) are removed.

FIG. 7 is an expanded view of the substrate 102 taken along line A-A show in FIG. 6. In the expanded view shown in FIG. 7, the substrate 102 includes an SRAM region 710 and a Logic region 750, which are on the substrate 102 but are not necessarily adjacent to one another. The SRAM region 710 includes an nFET region 720 and a pFET region 730. The Logic region 750 includes an nFET region 760 and a pFET region 770. Although the initial fabrication stages of a single structure is shown in each of the nFET region 720, pFET region 730, nFET region 760, and pFET region 770, it is understood that in practice the regions 720, 730, 760, 770 will each include multiple structures that will be fabricated into multiple final nanosheet FET devices. Although the nFET region 720 and the pFET region 730 are depicted as being adjacent to one another on the substrate 102, in practice they are not necessarily adjacent to one another. Similarly, although the nFET region 760 and the pFET region 770 are depicted as being adjacent to one another on the substrate 102, in practice they are not necessarily adjacent to one another. The individual nanosheet FETs that will be formed in the nFET region 720, the pFET region 730, the nFET region 760, and the pFET region 770 are separated from one another by the shallow trench isolation (STI) regions 702. The structure 100A that is depicted in FIG. 6 is depicted in the nFET region 720. The same fabrication operations shown in FIGS. 1-6 have been used to form the structures shown under the pFET region 730, the nFET region 760, and the pFET region 770. The structure shown under the pFET region 730 includes a conformal gate dielectric 732 deposited around each channel nanosheet 112B, 114B, 116B, 118B. The structure shown under the NFET region 760 includes a conformal gate dielectric 722 deposited around each channel nanosheet 112C, 114C, 116C, 118C. The structure shown under the pFET region 770 includes a conformal gate dielectric 772 deposited around each channel nanosheet 112D, 114D, 116D, 118D.

Because circuitry in the SRAM region 710 needs less current than circuitry in the Logic region 750, the channel nanosheets of the nanosheet FETs in the SRAM region 710 are narrower than the channel nanosheets of the Logic region 750. As an example, the channel nanosheets 112A, 114A, 116A, 118A, 112B, 114B, 116B, 118B shown in FIG. 7 are about 15 nm wide, and the channel nanosheets nanosheet 112C, 114C, 116C, 118C, 112D, 114D, 116D, 118D shown in FIG. 7 are about 50 nm wide. The space between adjacent channel nanosheets (e.g., channel nanosheets 116B, 118B) after deposition of the gate dielectric layers 722, 732, 762, 772 is about 4 nm. All dimensions depicted in the examples shown in the figures are provided as non-limiting examples of how aspects of the invention can be implemented.

FIGS. 7-13 illustrate a novel gate-last fabrication process according to aspects of the invention. In general, the dummy gate 304 (shown in FIG. 6), hard mask 306 (shown in FIG. 6), and sacrificial nanosheets 122A, 124A, 126A (shown in FIG. 5) will be replaced with novel multi-segmented metal gate structures (e.g., 824, 902 shown in FIG. 9) having selectively formed air gaps 826A, 836A, 866, 876 that facilitate the rapid etching of the multi-segmented metal gate structures independent of the width of the respective channel nanosheets (e.g., narrow channel nanosheet 118A and wide channel nanosheet 118C shown in FIG. 9).

Referring specifically to the nFET region 720 shown in FIG. 7, the dummy gate 304 (shown in FIG. 6) and hard mask 306 (shown in FIG. 6) have been removed, and a conformal and relatively thin gate dielectric 722 has been deposited around each channel nanosheet 112A, 114A, 116A, 118A. In embodiments of the invention, the gate dielectrics 722, 732, 762, 772 are each relatively thin (e.g., from about 1 nm to about 3 nm). In embodiments of the invention, the relatively thin gate dielectric layer 722 can be formed from one or more gate dielectric films such as thermally oxidized Si or SiGe, thermally oxidized and nitrided Si or SiGe, an interlayer dielectric (ILD) material and a high-k dielectric. The gate dielectric films can be a dielectric material having a dielectric constant greater than, for example, 3.9, 7.0, or 10.0. Non-limiting examples of suitable materials for the high-k dielectric films include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric films can further include dopants such as, for example, lanthanum and aluminum. The gate dielectric films can be formed by suitable deposition processes, for example, CVD, PECVD, atomic layer deposition (ALD), evaporation, physical vapor deposition (PVD), chemical solution deposition, or other like processes.

Figure 8:
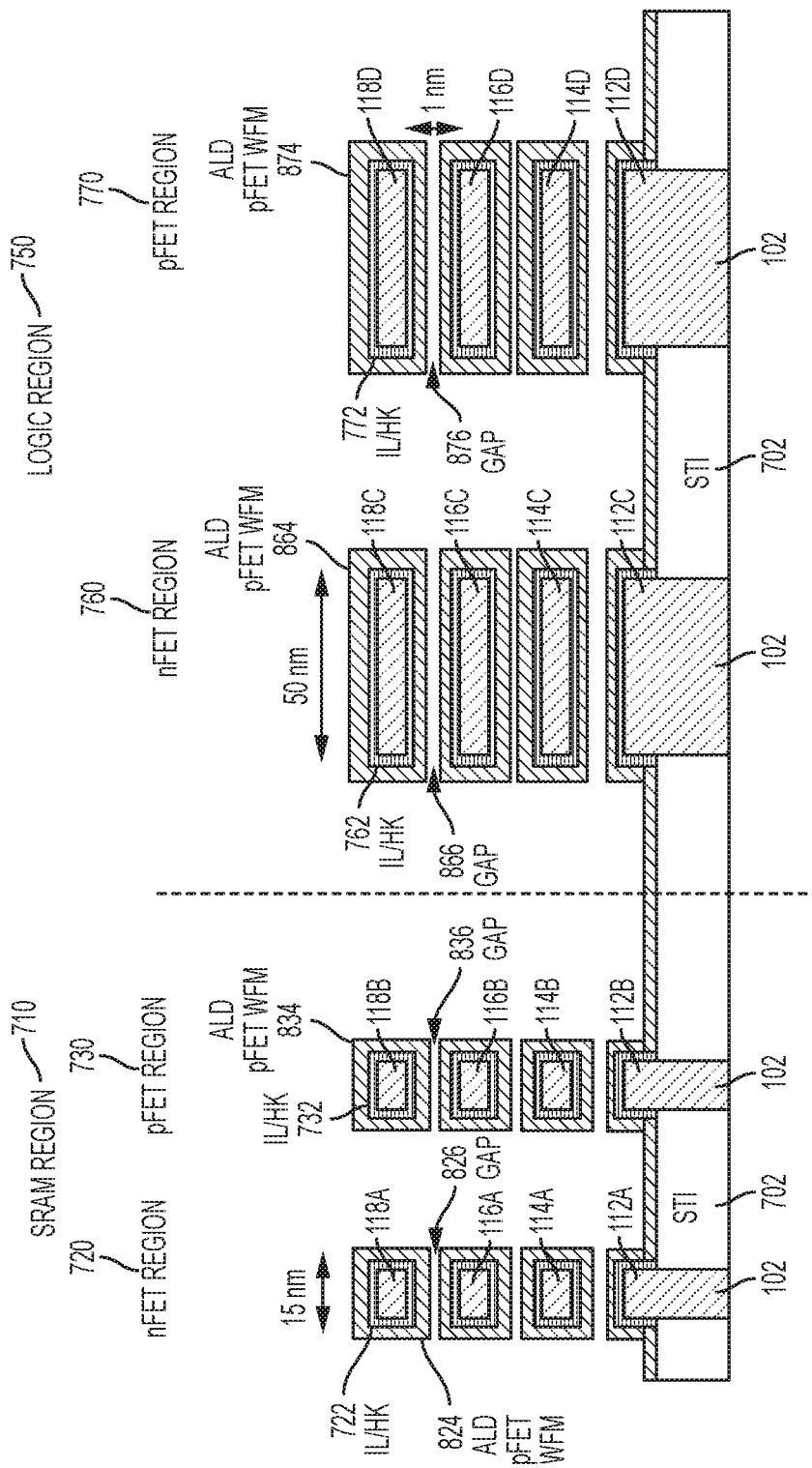

In FIG. 8, known semiconductor fabrication operations have been used to conformally deposit first regions 824, 834, 864, 874 of a pFET WFM around the channel nanosheets 112A, 114A, 116A, 118B, 112B, 114B, 116B, 118B, 112C, 114C, 116C, 118C, 112D, 114D, 116D, 118D. In embodiments of the invention, the pFET WFM of the first regions 824, 834, 864, 874 is TiN. In embodiments of the invention, the conformal deposition is performed by an ALD process. In embodiments of the invention, the thickness of each of the first regions 824, 834, 864, 874 is about 1.7 nm, which, using the example dimensions depicted in FIGS. 7 and 8, leaves air gaps 826, 836, 866, 876 of about 1 nm between each of the channel nanosheets 112A, 114A, 116A, 118B, 112B, 114B, 116B, 118B, 112C, 114C, 116C, 118C, 112D, 114D, 116D, 118D.

Figure 9:
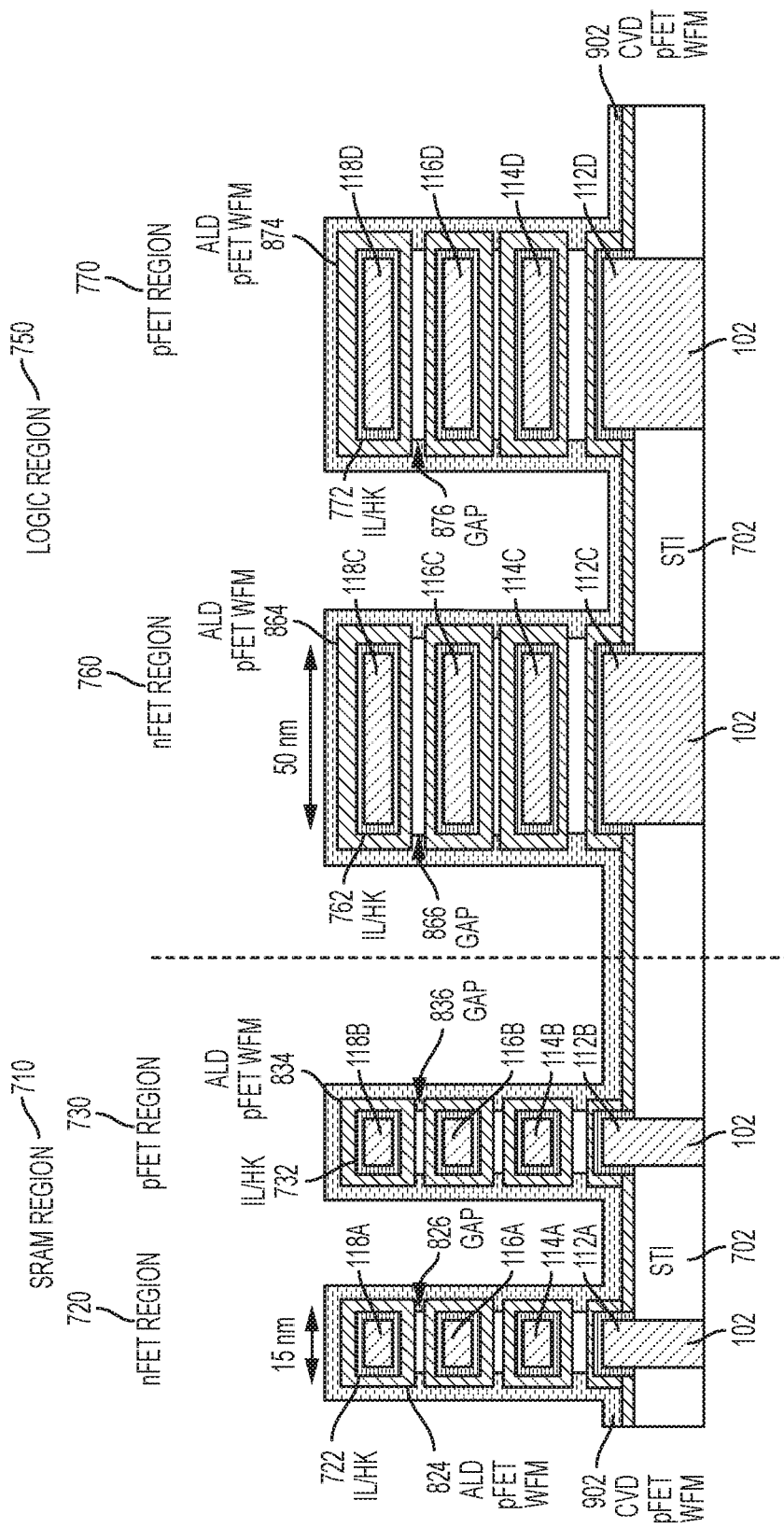

In FIG. 9, known semiconductor fabrication operations have been used to non-conformally deposit second regions 902 of the pFET WFM around the first regions 824, 834, 864, 874. In embodiments of the invention, the pFET WFM of the second regions 902 is TiN. In embodiments of the invention, the non-conformal deposition is performed by a CVD or PVD process. In embodiments of the invention, the thickness of the second regions 902 is about 1.0 nm. End regions of the air gaps 826, 836, 866, 876 (shown in FIG. 8) are closed off by the second regions 902 to form enclosed air gaps 826A, 836A, 866A, 876A. Non-conformal deposition processes are less precise than conformal deposition processes. As a result, the non-conformal deposition cannot move into the air gaps 826, 836, 866, 876, which close off the ends of the air gaps 826, 836, 866, 876 but does not fill in the air gaps 826, 836, 866, 876. In embodiments of the invention, the second region of the non-conformally deposited gate metal is relatively thin (e.g., about 1 nm) in comparison to the first region of the conformally deposited gate metal (e.g., about 1.7 nm).

Figure 10:
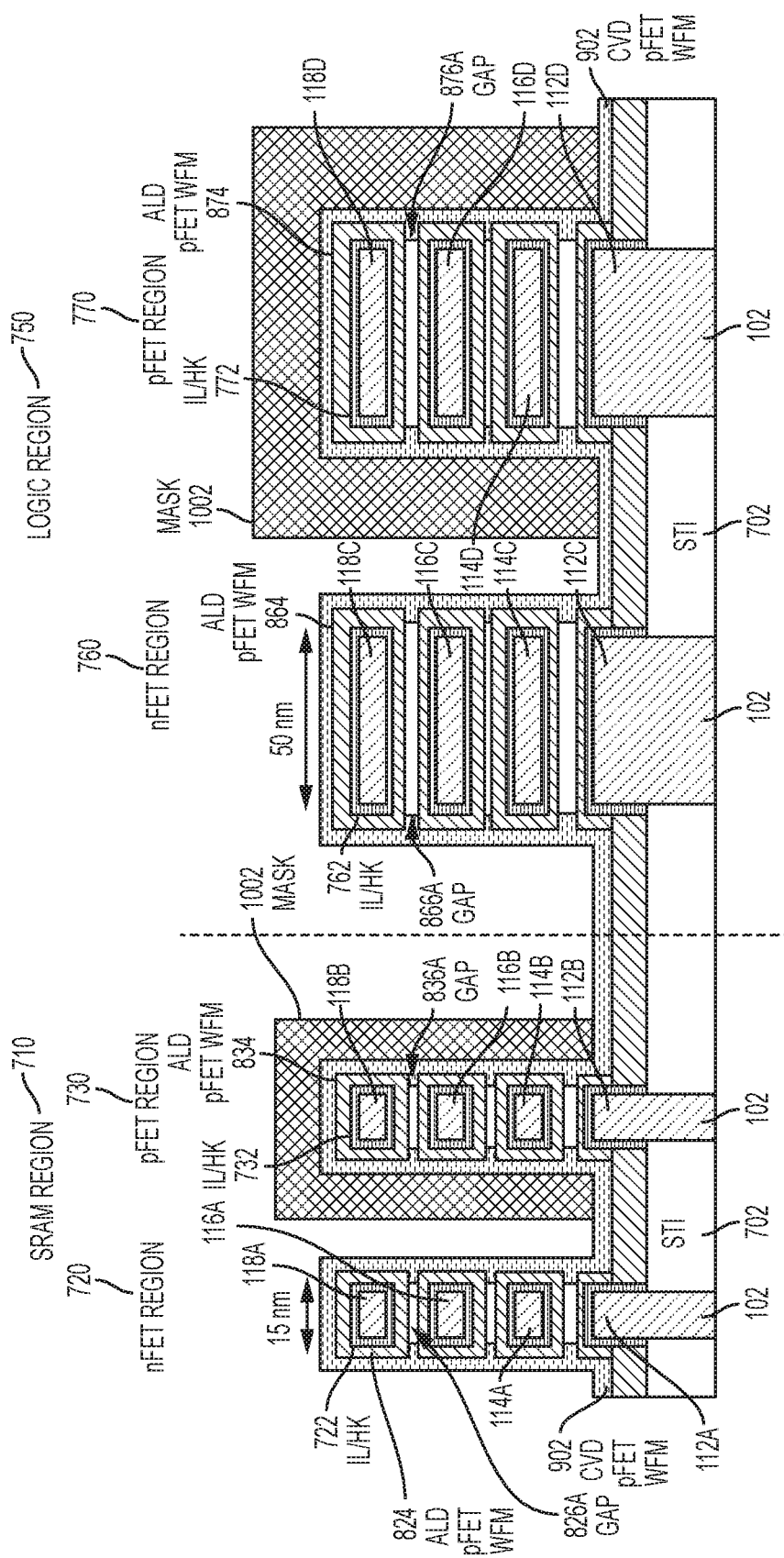

In FIG. 10, known semiconductor fabrication processes have been used to deposit blocking masks 1002, 1004 over the pFET region 730 and the pFET region 770, respectively. In embodiments of the invention, the blocking masks 1002, 1004 are an organic planarization layer (OPL). In general, OPLs are used as etch masks for pattern transfers into inorganic substrates, to fill pre-existing features, and to planarize the substrate to allow for larger patterning process windows.

Figure 11:
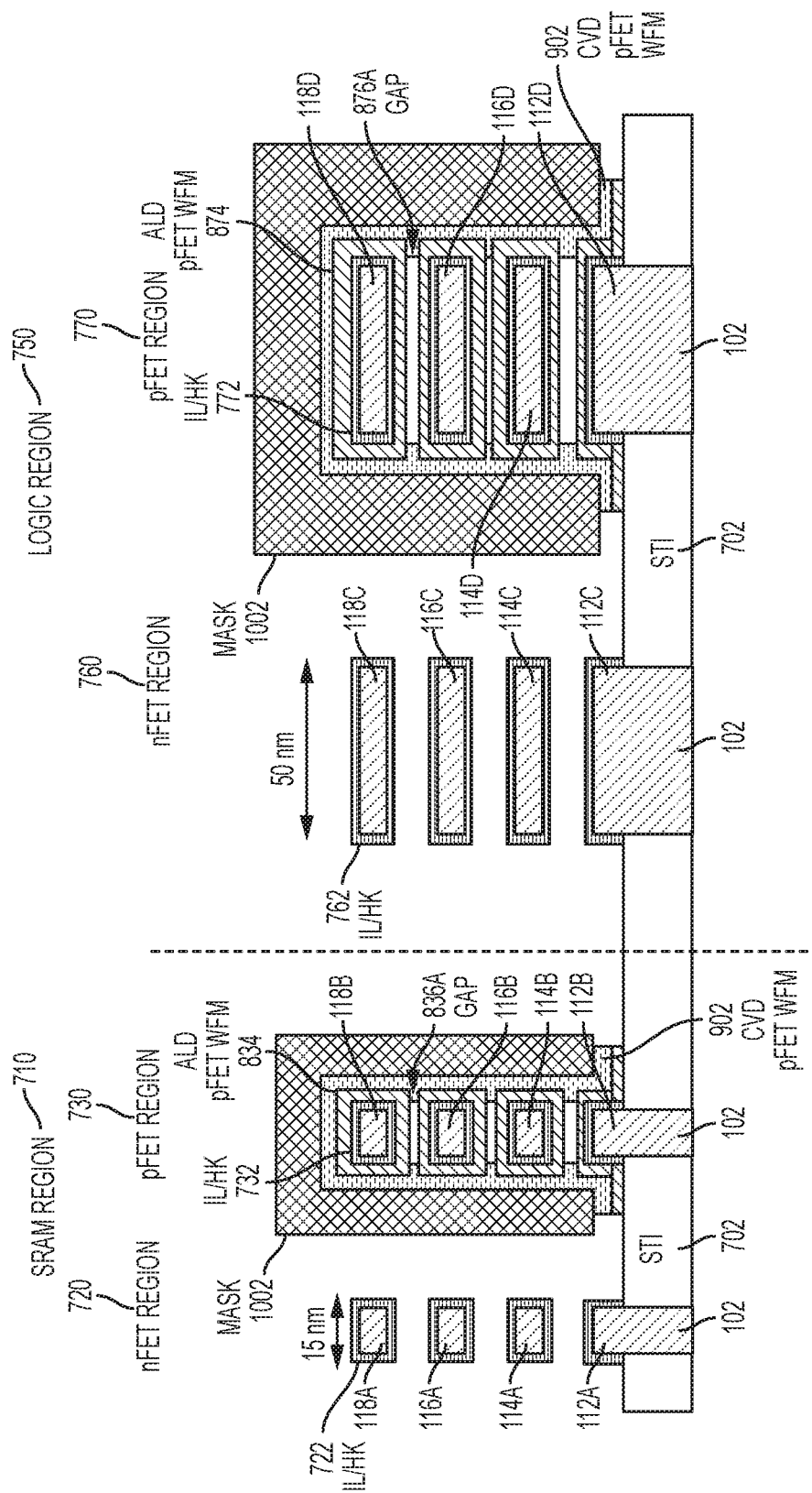

In FIG. 11, known fabrication operations have been used to remove the first and second regions 824, 864, 902 of the pFET WFM from the nFET region 720 and the nFET region 760. In accordance with aspects of the invention, the removal etchant moves through the relatively thin non-conformally deposited second region 902 of the pFET WFM relatively quickly to access the surfaces areas of the first regions 824, 834 that define the air gaps 826A, 866A. In accordance with embodiments of the invention, the air gaps 826A, 866A extend along width dimensions of the channel nanosheets 112A, 114A, 116A, 118A, 112C, 114C, 116C, 118C that the first and second regions 824, 864, 902 of the pFET WFM surround in the nFET region 720 and the nFET region 760. The air gaps 826A, 866A create additional surface areas of the pFET WFM, and these additional surface areas provide additional access points for the etchant that is used to remove the pFET WFM from the channel nanosheets 112A, 114A, 116A, 118A, 112C, 114C, 116C, 118C in the nFET region 720 and the nFET region 760. The additional access points on the first and second regions 824, 864, 902 of the pFET WFM speed up the gate metal removal process and make the speed of the gate metal removal process less dependent on the width dimension of the channel nanosheet. Accordingly, using the gate deposition process according to aspects of the invention, removing the first and second regions 824, 864, 902 of the pFET WFM from around the narrow channel nanosheets 112A, 114A, 116A, 118A can occur in substantially the same amount of time that it takes to remove the first and second regions 824, 864, 902 of the pFET WFM from around the wide channel nanosheets 112C, 114C, 116C, 118C, and the gate metal removal process does not need to be applied for a duration/intensity that would allow the removal etchant to attack the first and second regions 824, 864, 902 of the pFET WFM in the pFET regions 730, 770 where the first and second regions 824, 864, 902 of the p FET WFM are expected to remain.

Figure 12:
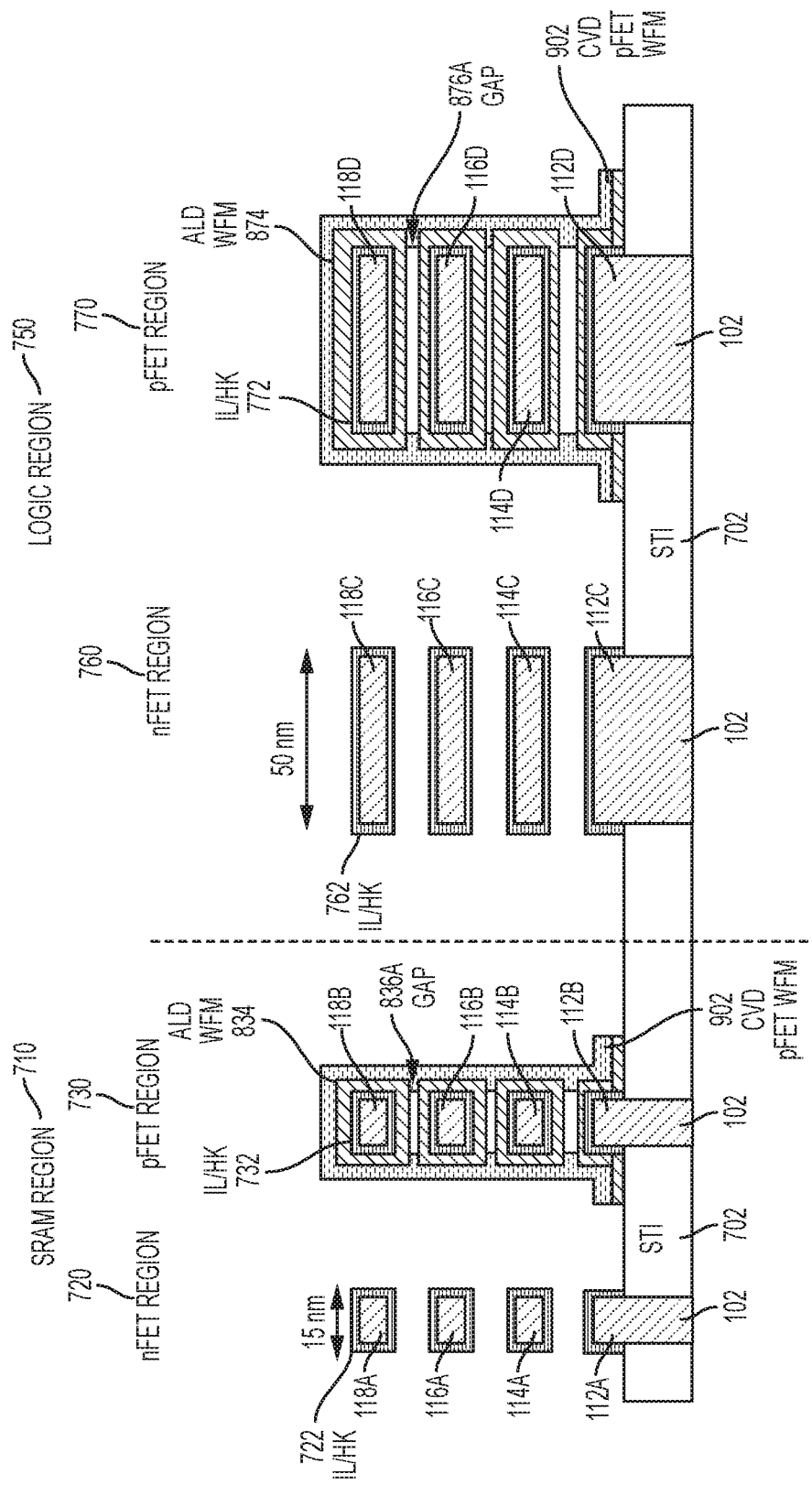

In FIG. 12, known fabrication operations (e.g., a plasma etch) have been used to remove the protective blocking masks 1002, 1004 from over the pFET region 730 and the pFET region 770, respectively.

Figure 13:
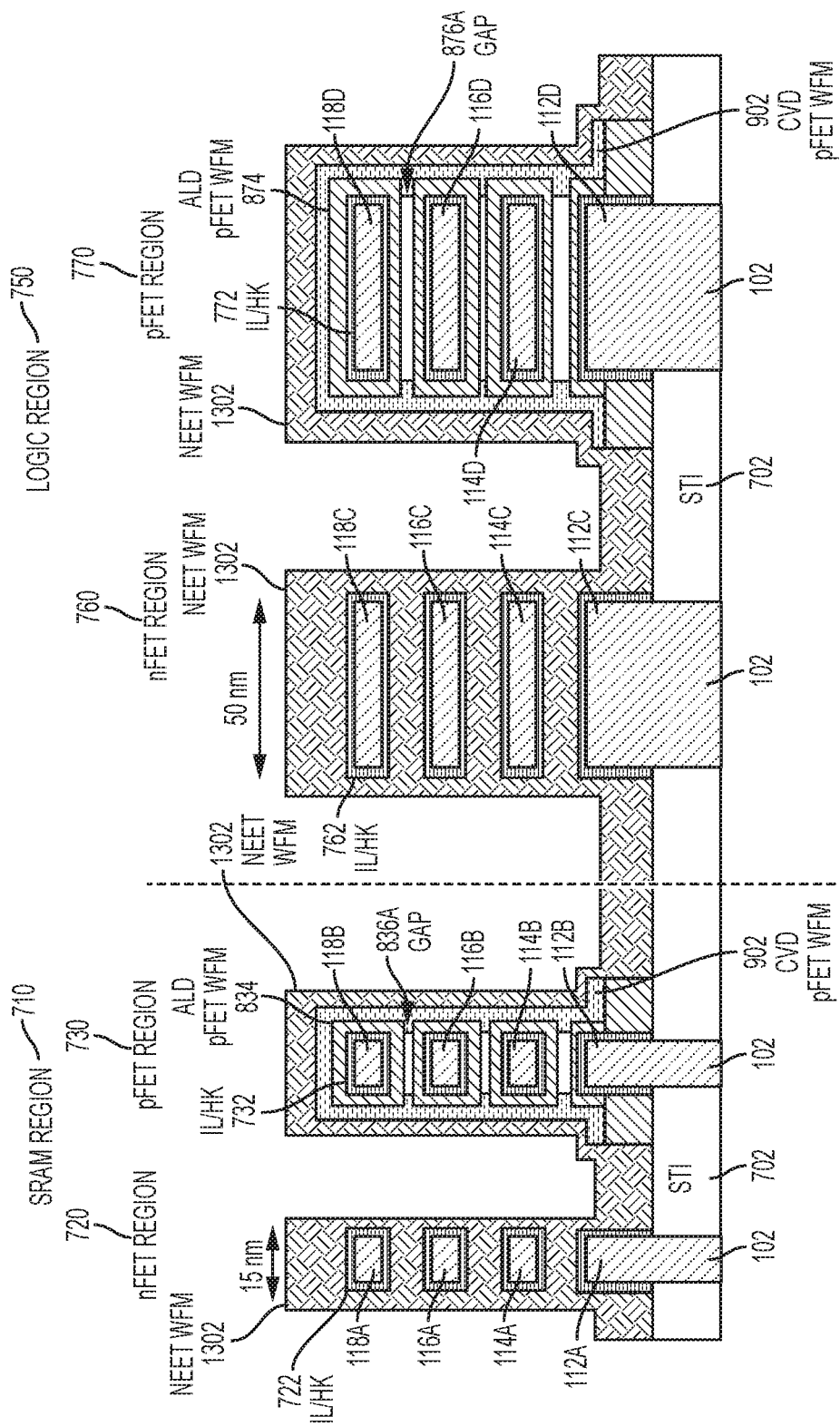

In FIG. 13, known fabrication operations have been used to deposit an nFET WFM 1302 in the nFET regions 720, 760 and the pFET regions 730, 770. In embodiments of the invention, the nFET WFM 1302 is a stack that includes TiN/TiAlC/TiN. In embodiments of the invention, the nFET WFM 1302 is conformally deposited using an ALD process. The non-conformally deposited pFET WFM 902 prevents the conformally deposited the nFET WFM 1302 from entering the air gaps 836A, 876A, which are still present in the pFET regions 730, 770, respectively. After the above-described deposition operations, the nFET WFM 1302 is around the channel nanosheets 112A, 114A, 116A, 118A, 112C, 114C, 116C, 118C, and a stack formed that includes the conformally-deposited pFET WFMs 834, 874, the non-conformally deposited pFET WFMs 902, and the conformally deposited nFET WFMs 1302 positioned around the channel nanosheets 112B, 114B, 116B, 118, 112D, 114D, 116D, 118D.

In general, the threshold voltage (Vt) of a MOSFET is the voltage that is required to turn the transistor on. As power and performance optimization have become increasingly important, the number of different threshold voltages available on a process have proliferated. Multiple threshold voltages allow designers to select the best option for each section of a design by trading-off power and performance. Vt is determined by several factors including the WF of the gate metal stack. The high-k metal gate (HKMG) process utilized in accordance with aspects of the invention provides two types of WFM in the gate electrode metal stacks, one for pFET transistors (pFET regions 730, 770) and one for the nFET transistors (n FET regions 720, 760). The use of dual WFMs is part of optimizing the nFET and pFET threshold voltages. In embodiments of the invention, the threshold voltages (Vt) of the nanosheet transistors in the pFET regions 730, 770 are primarily determined by the material (e.g., TiN) from which the PFET WFM 834, 874, 902 is formed and not by the thickness of the PFET WFMs 834, 874, 902. For example, using the example dimensions depicted in FIGS. 7 and 8, it is expected that the Vt in the pFET regions 730, 770 will vary by no more than about 15 mV in comparison with the Vt that would be expected if the air gaps the air gaps 836A, 876A were not present.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "slightly less than," "primarily," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A configuration of nanosheet field effect transistor (FET) devices formed on a substrate, the nanosheet FET devices comprising:
   a first nanosheet FET comprising:
      a first channel nanosheet;
      a second channel nanosheet over the first channel nanosheet;
      a first gate structure around the first channel nanosheet; and
      a second gate structure around the second channel nanosheet, wherein a first air gap is between the first gate structure and the second gate structure.

2. The devices of claim 1 further comprising:
   a second nanosheet FET comprising:
      a third channel nanosheet;
      a fourth channel nanosheet over the third channel nanosheet;
      a third gate structure around the third channel nanosheet; and
      a fourth gate structure around the fourth channel nanosheet, wherein a second air gap is between the third gate structure and the fourth gate structure.

3. The devices of claim 2, wherein the first gate structure comprises a conformally deposited region.

4. The devices of claim 3, wherein the first gate structure further comprises a non-conformally deposited region.

5. The devices of claim 2, wherein the first gate structure comprises a gate metal having a work function configured for operation in a first type of nanosheet FET that is configured to operate based on a first type of majority carrier.

6. The devices of claim 5, wherein the second gate structure comprises the gate metal having the work function configured for operation in the first type of nanosheet FET that is configured to operate based on the first type of majority carrier.

7. The devices of claim 2, wherein the third gate structure comprises a gate metal having a work function configured for operation in a second type of nanosheet FET configured to operate based on a second type of majority carrier.

8. The devices of claim 7, wherein the fourth gate structure comprises the gate metal having the work function configured for operation in the second type of nanosheet FET configured to operate based on the second type of majority carrier.

9. A configuration of nanosheet field effect transistor (FET) devices formed on a substrate, the nanosheet FET devices comprising:
   in a first region of the substrate:
      a first channel nanosheet;
      a second channel nanosheet over the first channel nanosheet;
      a first gate structure around the first channel nano sheet; and
      a second gate structure around the second channel nanosheet, wherein a first air gap is between the first gate structure and the second gate structure;
   in a second region of the substrate:
      a third channel nanosheet;
      a fourth channel nanosheet over the third channel nanosheet;
      a third gate structure around the third channel nanosheet;
      a fourth gate structure around the fourth channel nanosheet, wherein a second air gap is between the third gate structure and the fourth gate structure.

10. The devices of claim 9, wherein the first air gap extends along a first width dimension of the first channel nanosheet and along a second width dimension of the second channel nanosheet.

11. The devices of claim 10, wherein the second air gap extends along a third width dimension of the third channel nanosheet and along a fourth width dimension of the fourth channel nanosheet.

12. The devices of claim 11, wherein the first width dimension is less than the second width dimension.

13. The devices of claim 12, wherein the third gate structure comprises:
   a conformally deposited first region; and
   a non-conformally deposited second region.

14. The devices of claim 13, wherein a thickness dimension of the non-conformally deposited second region is less than a thickness dimension of the conformally deposited first region.

15. The devices of claim 14, wherein the fourth gate structure comprises:
   a conformally deposited third region; and
   a non-conformally deposited fourth region.

16. The devices of claim 15, wherein a thickness dimension of the non-conformally deposited fourth region is less than a thickness dimension of the conformally deposited third region.

17. The devices of claim 9, wherein the first gate structure, the second gate structure, the third gate structure, and the fourth gate structure comprise a gate metal having a work function configured for operation in a first type of FET configured to operate based on a first type of majority carrier.

18. The devices of claim 17 further comprising a fifth gate structure formed around the third channel nanosheet.

19. The devices of claim 18 further comprising a sixth gate structure formed around the fourth channel nanosheet.

20. The devices of claim 19, wherein the fifth gate structure and the sixth gate structure comprise a gate metal having a work function configured for operation in a second type of FET configured to operate based on a second type of majority carrier.

* * * * *